(12) United States Patent
Joshi et al.

(10) Patent No.: US 12,185,511 B2
(45) Date of Patent: Dec. 31, 2024

(54) POWER ELECTRONICS SYSTEMS COMPRISING A TWO-PHASE COLD PLATE HOUSING A VAPORIZATION STRUCTURE

(71) Applicant: Toyota Motor Engineering & Manufacturing North America, Inc., Plano, TX (US)

(72) Inventors: Shailesh N. Joshi, Ann Arbor, MI (US); Danny J. Lohan, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 361 days.

(21) Appl. No.: 17/166,652

(22) Filed: Feb. 3, 2021

(65) Prior Publication Data
US 2022/0192060 A1 Jun. 16, 2022

Related U.S. Application Data

(60) Provisional application No. 63/126,062, filed on Dec. 16, 2020.

(51) Int. Cl.
*H05K 7/20* (2006.01)
*F28F 3/12* (2006.01)

(52) U.S. Cl.
CPC ........... *H05K 7/20936* (2013.01); *F28F 3/12* (2013.01); *H05K 7/20509* (2013.01)

(58) Field of Classification Search
CPC .... H05K 7/20936; H05K 7/20509; F28F 3/12
(Continued)

(56) References Cited

U.S. PATENT DOCUMENTS

| 4,203,129 A | * | 5/1980 | Oktay | H01L 23/473 174/16.3 |
| 5,411,077 A | * | 5/1995 | Tousignant | H01L 23/427 165/46 |

(Continued)

FOREIGN PATENT DOCUMENTS

| EP | 3177125 B1 | 12/2019 | |
| WO | WO-2017100568 A2 | * 6/2017 | ............. B23P 15/26 |

OTHER PUBLICATIONS

Mohammad Reza Shaeri, et al., "Thin Hybrid Capillary Two-Phase Cooling System," Journal, International Communications In Heat And Mass Transfer, Published Mar. 2020, vol. 112, Advanced Cooling Technologies, Inc., Lancaster, PA 17601, URL: https://www.sciencedirect.com/science/article/abs/pii/S0735193320300154.

(Continued)

*Primary Examiner* — Anatoly Vortman
(74) *Attorney, Agent, or Firm* — Dinsmore & Shohl LLP

(57) ABSTRACT

A two-phase cold plate that includes a manifold body having a fluid inlet and a fluid outlet each fluidly coupled to a fluid pathway housed within the manifold body and a vaporization structure housed within the manifold body such that the fluid pathway is disposed over the vaporization structure. The vaporization structure includes a cavity cover, a porous surface, a vapor cavity disposed between the cavity cover and the porous surface, and one or more porous feeding posts extending between the cavity cover and the porous surface. The one or more porous feeding posts fluidly coupled the fluid pathway with the porous surface of the vaporization structure and the porous surface includes a plurality of nucleation sites configured to induce vaporization of a cooling fluid and facilitate vapor flow into the vapor cavity of the vaporization structure.

19 Claims, 5 Drawing Sheets

(58) Field of Classification Search
USPC .......................................................... 361/700
See application file for complete search history.

(56) References Cited

U.S. PATENT DOCUMENTS

| | | | | |
|---|---|---|---|---|
| 5,720,338 | A * | 2/1998 | Larson | F28F 21/065 257/E23.09 |
| 6,082,443 | A * | 7/2000 | Yamamoto | F28D 15/046 174/15.2 |
| 6,366,462 | B1 * | 4/2002 | Chu | H01L 23/427 257/714 |
| 6,466,441 | B1 | 10/2002 | Suzuki | |
| 6,942,018 | B2 * | 9/2005 | Goodson | F28D 15/00 174/15.1 |
| 6,990,816 | B1 | 1/2006 | Zuo et al. | |
| 7,265,979 | B2 * | 9/2007 | Erturk | H05K 7/20363 257/713 |
| 7,289,327 | B2 * | 10/2007 | Goodwin | H01L 23/473 257/E23.098 |
| 7,392,836 | B2 * | 7/2008 | Wong | F28D 15/046 165/104.33 |
| 7,443,023 | B2 * | 10/2008 | Wehrly, Jr. | H05K 1/189 257/730 |
| 7,545,644 | B2 * | 6/2009 | Fedorov | H01L 23/427 174/15.1 |
| 7,874,347 | B2 * | 1/2011 | Chen | F28F 19/02 165/104.21 |
| 8,081,461 | B2 * | 12/2011 | Campbell | H01L 23/4735 174/15.1 |
| 8,082,978 | B2 * | 12/2011 | Fedorov | F28D 15/00 165/80.4 |
| 8,154,873 | B2 * | 4/2012 | Lian | G06F 1/20 361/720 |
| 9,245,820 | B2 * | 1/2016 | Goldrian | H01L 23/473 |
| 9,531,247 | B2 | 12/2016 | Kuznetsov | |
| 2013/0032311 | A1 * | 2/2013 | Bhunia | F28D 15/046 165/104.26 |
| 2014/0190665 | A1 | 7/2014 | Joshi et al. | |
| 2014/0247557 | A1 * | 9/2014 | Qiu | H01L 23/427 165/104.21 |
| 2019/0014688 | A1 * | 1/2019 | Weibel | H01L 23/427 |
| 2019/0239395 | A1 | 8/2019 | Joshi et al. | |

OTHER PUBLICATIONS

Milnes P. David, et al., "Hydraulic And Thermal Characteristics Of A Vapor Venting Two-Phase Microchannel Heat Exchanger," Journal, International Journal of Heat and Mass Transfer, Published Dec. 2011, vol. 54, Issues 25-26, pp. 5504-5516, Dept. of Mechanical Engineering, Stanford University, Stanford, CA 94305, URL: https://www.sciencedirect.com/science/article/abs/pii/S0017931011004261.

* cited by examiner

POWER ELECTRONICS SYSTEMS COMPRISING A TWO-PHASE COLD PLATE HOUSING A VAPORIZATION STRUCTURE

CROSS-REFERENCE TO RELATED APPLICATION

This application claims priority to U.S. Provisional Patent Application No. 63/126,062, filed Dec. 16, 2020, which is hereby incorporated by reference in its entirety.

TECHNICAL FIELD

The present specification generally relates to power electronics systems, and more particularly, to power electronics systems having a two-phase cold plate for cooling heat generating devices.

BACKGROUND

Currently, power electronic devices (e.g., SiC IGBT or other switching devices) are positioned separate from and cooled separate from passive devices, such as the gate drive devices and capacitors which are used to control their operation. To dissipate high heat flux from power devices, single phase cooling is not adequate, and needs to utilize high performance cooling solution such as two-phase cooling. However, separately cooling power devices and passive devices increases package volume and current techniques for cooling both power devices and passive devices using two-phase cooling, such as techniques that use a porous coating for vaporization, suffers a high pressure drop when directing fluid into the porous coating.

Accordingly, a need exists for a unified cooling approach manages the high heat flux of the power components while reduced pump power and reduced package size.

SUMMARY

In one embodiment, a two-phase cold plate includes a manifold body having a fluid inlet and a fluid outlet each fluidly coupled to a fluid pathway housed within the manifold body and a vaporization structure housed within the manifold body such that the fluid pathway is disposed over the vaporization structure. The vaporization structure includes a cavity cover, a porous surface, a vapor cavity disposed between the cavity cover and the porous surface, and one or more porous feeding posts extending between the cavity cover and the porous surface. The one or more porous feeding posts fluidly coupled the fluid pathway with the porous surface of the vaporization structure and the porous surface includes a plurality of nucleation sites configured to induce vaporization of a cooling fluid and facilitate vapor flow into the vapor cavity of the vaporization structure.

In another embodiment, a power electronics system includes a two-phase cold plate and one or more heat generating devices thermally coupled to the two-phase cold plate. The two-phase cold plate includes a manifold body having a fluid inlet and a fluid outlet each fluidly coupled to a fluid pathway housed within the manifold body. A vaporization structure is housed within the manifold body such that the fluid pathway is disposed over the vaporization structure. The vaporization structure includes a cavity cover, a porous surface, a vapor cavity disposed between the cavity cover and the porous surface, and one or more porous feeding posts extending between the cavity cover and the porous surface. The one or more porous feeding posts fluidly coupled the fluid pathway with the porous surface of the vaporization structure and the porous surface includes a plurality of nucleation sites configured to induce vaporization of a cooling fluid and facilitate vapor flow into the vapor cavity of the vaporization structure.

In yet another embodiments, a method of removing heat from one or more heat generating devices includes directing a cooling fluid through a fluid inlet of a manifold body of a two-phase cold plate and into a fluid pathway disposed in the manifold body, the two-phase cold plate further including a vaporization structure fluidly coupled to the fluid pathway. The cooling fluid flows along the fluid pathway thereby removing heat from the one or more heat generating devices thermally coupled to the two-phase cold plate and at least a portion of the cooling fluid enters one or more porous feeding posts of the vaporization structure that fluidly couple the fluid pathway of with a vapor cavity of the vaporization structure thereby vaporizing at least a portion of the cooling fluid at a plurality of nucleation sites within the vaporization structure such that vapor flows into the vapor cavity and removes heat from the one or more heat generating devices thermally coupled to the two-phase cold plate. The method also including removing heated cooling fluid from a fluid outlet of the manifold body.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
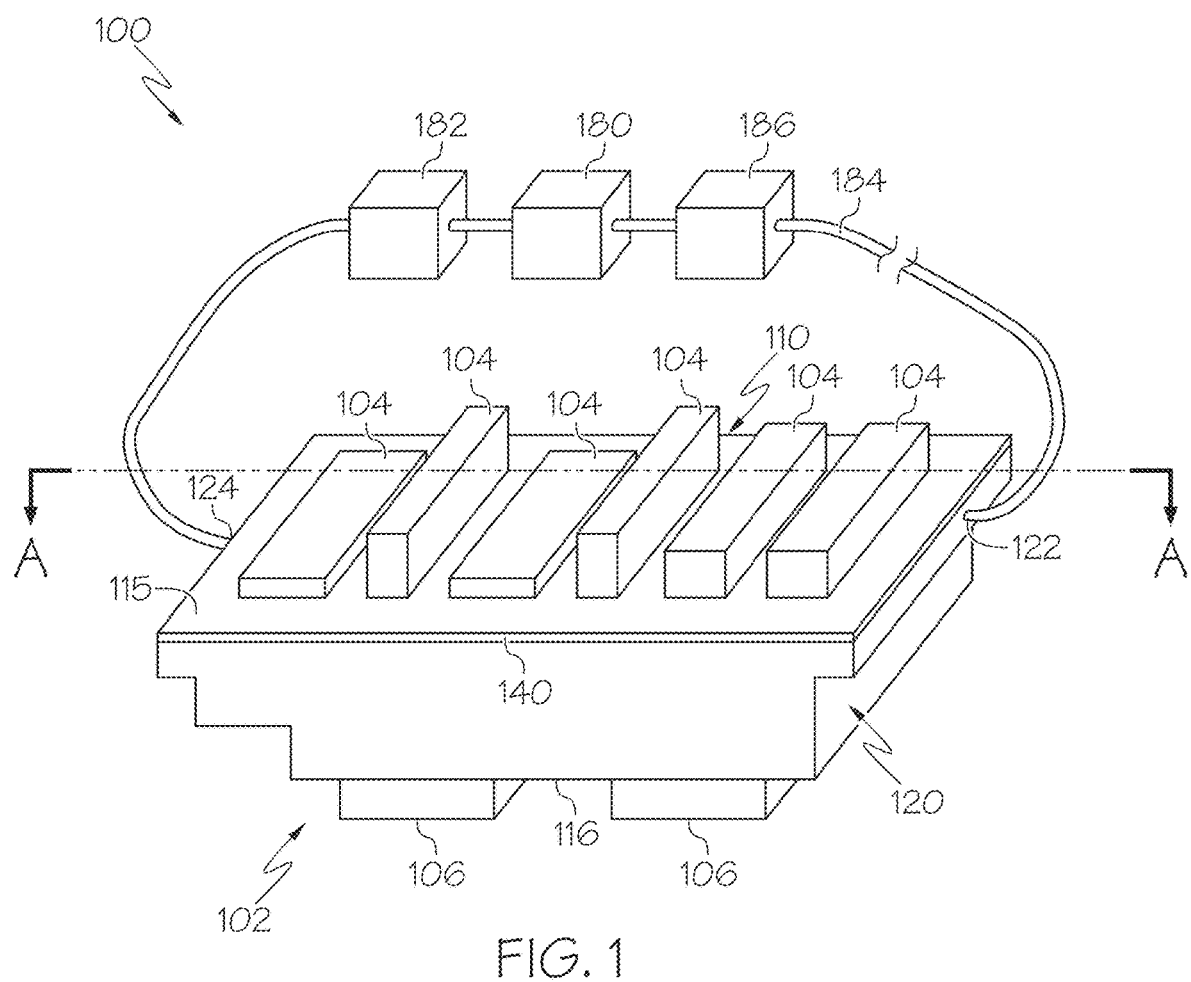
FIG. 1 schematically depicts an power electronics system having a two-phase cold plate thermally coupled to one or more heat generating devices, according to one or more embodiments shown and described herein.

Embodiments described herein are directed to a power electronics system that includes one or more heat generating devices, such as power electronic components and passive electronic components, and a two-phase cold plate for cooling the one or more heat generating devices. The two-phase cold plate includes a manifold body with a fluid inlet and a fluid outlet each fluidly coupled to a fluid pathway housed within the manifold body. The two phase cold plate further includes a vaporization structure housed within the manifold body such that the fluid pathway is disposed over the vaporization structure. The vaporization structure includes a cavity cover, a porous surface, a vapor cavity disposed between the cavity cover and the porous surface, and one or more porous feeding posts extending between the cavity cover and the porous surface. The one or more porous feeding posts fluidly couple the fluid pathway with the porous surface and the vapor cavity of the vaporization structure. Furthermore, at least the porous surface of the vaporization structure includes a plurality of nucleation sites configured to induce vaporization of a cooling fluid and facilitate vapor flow into the vapor cavity of the vaporization structure. In operation, liquid cooling fluid flows into the manifold body through the fluid inlet and flows along the fluid pathway. At least some of the liquid cooling fluid flowing along the fluid pathway is drawn into the vaporization structure, in particular, the one or more porous feeding posts of the vaporization structure by capillary action. In the vaporization structure, for example, at nucleation sites in the porous surface of the vaporization structure, the liquid cooling fluid evaporates and rises into the vapor cavity as a vapor cooling fluid. The vaporization process provides more cooling performance than the liquid flowing in the fluid pathway.

Thus, the two-phase cold plate may be used to cool multiple heat generating devices having different heat load levels. For example, the two-phase cold plate of the embodiments described herein facilitates cooling of low heat generating devices, such as passive electronics components, using the single phase cooling of fluid flowing in the fluid pathway and the cooling of high heat generating devices, such as power electronics components, using the two-phase cooling of vaporization at the porous surface of the vaporization structure. Moreover, because the liquid cooling fluid is drawn from the fluid pathway into the one or more porous feeding posts by a capillary force, the pressure drop that occurs within the two-phase cold plate is minimized, minimizing the pumping power needed to generate fluid flow through the two-phase cold plate. Moreover, the liquid cooling fluid is drawn into the one or more porous feeding posts vertically (i.e., in a downward vertical direction), further reducing the pressure drop. Thus, the two-phase cold plate facilitates efficient cooling of low power and high power components in a single, small form factor package with a minimal pressure drop, reducing the achievable package volume of the power electronics system without increasing the required pumping power. Various embodiments of the power electronics system and the two-phase cooling cold plate are described in more detail herein. Whenever possible, the same reference numerals will be used throughout the drawings to refer to the same or like parts.

Figure 2A:
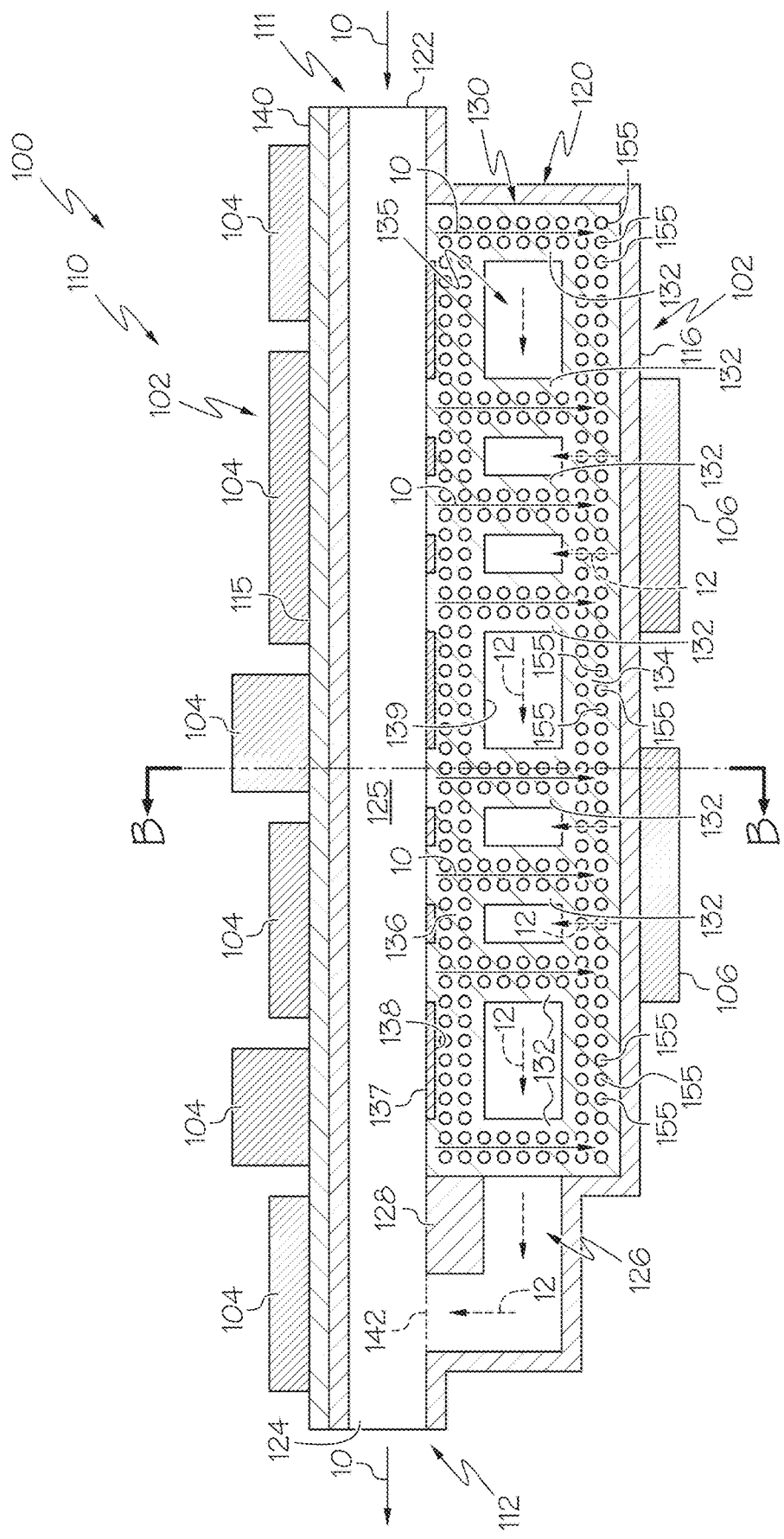
FIG. 2A schematically depicts a cross section of the two-phase cold plate of the power electronics system of FIG. 1 along line A-A, according to one or more embodiments shown and described herein.
Figure 2B:
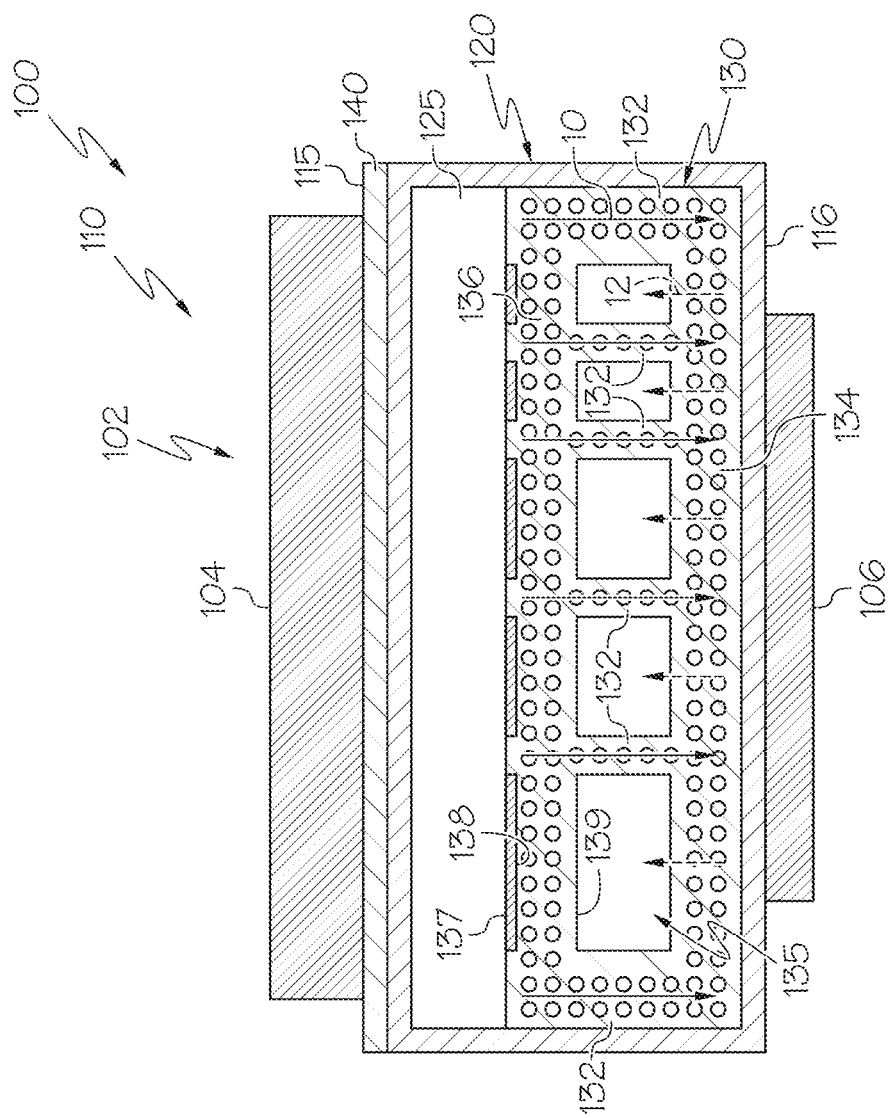
FIG. 2B schematically depicts a cross section of the two-phase cold plate of FIG. 2A along line B-B, according to one or more embodiments shown and described herein.

Referring now to FIG. 1, a power electronics system 100 comprising a two-phase cold plate 110 and one or more heat generating devices 102 is depicted. As depicted in more detail in FIGS. 2A and 2B, the two-phase cold plate 110 comprises a manifold body 120 that houses a fluid pathway 125 and a vaporization structure 130 fluidly coupled to the fluid pathway 125. The two-phase cold plate 110 also comprises a first end 111 opposite a second end 112 and a top surface 115 opposite a bottom surface 116. The manifold body 120 comprises a fluid inlet 122 and a fluid outlet 124 each fluidly coupled to the fluid pathway 125. As shown in FIGS. 1-2B, the fluid inlet 122 is positioned at the first end 111 of the two-phase cold plate 110 and the fluid outlet 124 is positioned at the second end 112 of the two-phase cold plate 110. The fluid pathway 125 is disposed over the vaporization structure 130 such that cooling fluid flowing in the fluid pathway 125 flows over the vaporization structure. Put another way, the fluid pathway 125 is positioned between the vaporization structure 130 and the top surface 115 of the two-phase cold plate 110 and the vaporization structure 130 is positioned between the fluid pathway 125 and the bottom surface 116 of the two-phase cold plate 110. It should be understood that the terms "top" and "bottom" are used to described the relative positioning of the surfaces and components of the two-phase cold plate 110 during a cooling operation. It also should be understood that the top surface 115 may be temporarily positioned below the bottom surface 116 during manufacture, installation, maintenance, or any other non-operational activity in which the two-phase cold plate 110 may be moved.

Referring now to FIGS. 2A and 2B, the vaporization structure 130 comprises a cavity cover 136, a porous surface 134, a vapor cavity 135 disposed between the cavity cover 136 and the porous surface 134, and one or more porous feeding posts 132 extending between the cavity cover 136 and the porous surface 134, for example, extending through the vapor cavity 135. It should be understood that embodiments are contemplated that comprise a plurality of porous feeding posts 132, as depicted in FIGS. 2A and 2B and embodiments are contemplated that comprise a single porous feeding post 132. At least a portion of the vaporization structure 130 comprises a wicking structure made of a porous media, such as sintered metal particles (such as copper particles or nickel particles), a metal inverse opal (MIO) structure 150 (FIGS. 3A and 3B), or a combination thereof. In particular, at least the one or more porous feeding posts 132 and the porous surface 134 comprise a wicking structure made from porous media. In some embodiments, the cavity cover 136 may also comprises a wicking structure made from porous media. The porous media facilies capillary flow of cooling fluid into the vaporization structure 130. In particular, cooling fluid may be drawn into the one or more porous feeding posts 132 by a capillary force. In addition, the porous media comprises a plurality of nucleation sites 155 configured to induce vaporization of a cooling fluid. Indeed, the nucleation sites 155 in the porous surface 134 induce vaporization of the cooling fluid drawn to the porous surface 134 through the one or more porous feeding posts 132 and facilitate vapor flow from the porous surface 134 into the vapor cavity 135 of the vaporization structure 130, as shown by dashed arrow 12.

In some embodiments, the porous media of the one or more porous feeding posts 132 comprise a graded porosity. For example, the porosity of the porous feeding posts 132 may be greater at locations nearer the fluid pathway 125 (i.e., upper portions) and the porosity of the porous feeding posts 132 may be lower at locations nearer the porous surface 134 (i.e., lower portion). Without intending to be limited by theory, the higher porosity regions have larger pore sizes and thus have increased permeability, facilitating cooling fluid entry into the one or more porous feeding posts 132 and the lower porosity regions of the one or more porous feeding posts 132 have smaller pore sizes, resulting in increased capillary pressure. Indeed, the graded porosity is such that a porosity at an interface between the one or more porous feeding posts 132 and the fluid pathway 125 is greater than a porosity at locations of the one or more porous feeding posts laterally adjacent the vapor cavity 135, locations which may still have a greater porosity than locations of the one or more porous feeding posts 132 at the porous surface 134. In some embodiments, the graded porosity of the porous feeding posts 132 is a continuous graded porosity, continuously increasing between the fluid pathway 125 to the porous surface 134. In other embodiments, the graded porosity of the porous feeding posts 132 is a stepwise graded porosity, intermittently increasing between the fluid pathway 125 to the porous surface 134.

Referring again to FIGS. 2A and 2B, the cavity cover 136 comprises a pathway facing surface 138 opposite a cavity facing surface 139. The pathway facing surface 138 faces the fluid pathway 125 and the cavity facing surface 139 faces the vapor cavity 135. In some embodiments, for example, embodiments in which the cavity cover 136 comprises a porous media, a hydrophilic layer 137 may be intermittently disposed on the pathway facing surface 138 of the cavity cover 136 such that regions of the pathway facing surface 138 aligned with the one or more porous feeding posts 132 are free of the hydrophilic layer. Thus, cooling fluid is drawn into the vaporization structure 130 via the porous feeding posts 132. This allows cooling fluid to traverse the vapor cavity 135 via the porous feeding posts 132 and reach the porous surface 134 while still in liquid form where the cooling fluid vaporized (e.g., at nucleation sites 155 in the porous surface 134) and rises into the vapor cavity 135. In other embodiments, the hydrophilic layer 137 is not present and the cavity cover 136 may comprise a porous media having a lower porosity (and thus, smaller pore sizes, lower permeability and higher liquid pressure drop) than the porous media of the porous feeding posts 132. In this embodiment, the low porosity of the cavity cover 136 makes liquid entry into the cavity cover 136 more difficult than liquid entry into the porous feeding posts 132 because the porous feeding posts 132 are more permeable than the cavity cover 136. Thus, in this embodiment, liquid cooling fluid flows primarily into the vaporization structure 130 via the porous feeding posts 132. However, this lower porosity still provides sufficient porosity and permeability for vapor flow and thus the cavity cover 136 facilitates flow of vaporized cooling fluid from the vapor cavity 135 back into the fluid pathway 125, where the vaporized cooling fluid condensates and may exit the two-phase cold plate 110 via the fluid outlet 124. In yet other embodiments, the cavity cover 136 comprises a non-porous material and the porous feeding posts 132 extend through the cavity cover 136 to the fluid pathway 125. In this embodiment, the non-porous material of the cavity cover 136 ensures that cooling fluid only enters the vaporization structure 130 at the porous feeding posts 132.

As depicted in FIG. 2A, in some embodiments, the manifold body 120 further comprises a vapor outlet pathway 126 fluidly coupling the vapor cavity 135 of the vaporization structure 130 with the fluid pathway 125 and a vapor pathway separator 128 disposed between the vapor outlet pathway 126 and the fluid pathway 125. The vapor pathway separator 128 forms a top surface for a portion of the vapor outlet pathway 126 allowing the vapor outlet pathway 126 to extend laterally away from the vaporization structure 130 before opening to the fluid pathway 125 at a vapor opening 129 of the vapor outlet pathway 126. Indeed, the vapor outlet pathway 126 and the fluid pathway 125 form an interface at the vapor opening 129. In some embodiments, a selective membrane 142 is disposed at the vapor opening 129. The selective membrane 142 is configured to permit vapor traversal and block liquid traversal. Thus, vaporized cooling fluid flowing in the vapor outlet pathway 126 may enter the fluid pathway 125 through the selective membrane 142, while liquid cooling fluid flowing in the fluid pathway 125 is prevented from flowing into the vapor outlet pathway 126, facilitating flow of vaporized cooling fluid from the vapor cavity 135 back into the fluid pathway 125, where the vaporized cooling fluid condensates and may exit the two-phase cold plate 110 via the fluid outlet 124. While the vapor opening 129 depicted in FIG. 2A opens to the fluid pathway 125, other embodiments are contemplated in which the vapor opening 129 is at an outer surface of the two-phase cold plate 110 such that vaporized cooling fluid may exit the two-phase cold plate separated from the fluid outlet 124 and the liquid cooling fluid flowing in the fluid pathway 125.

Figure 3:
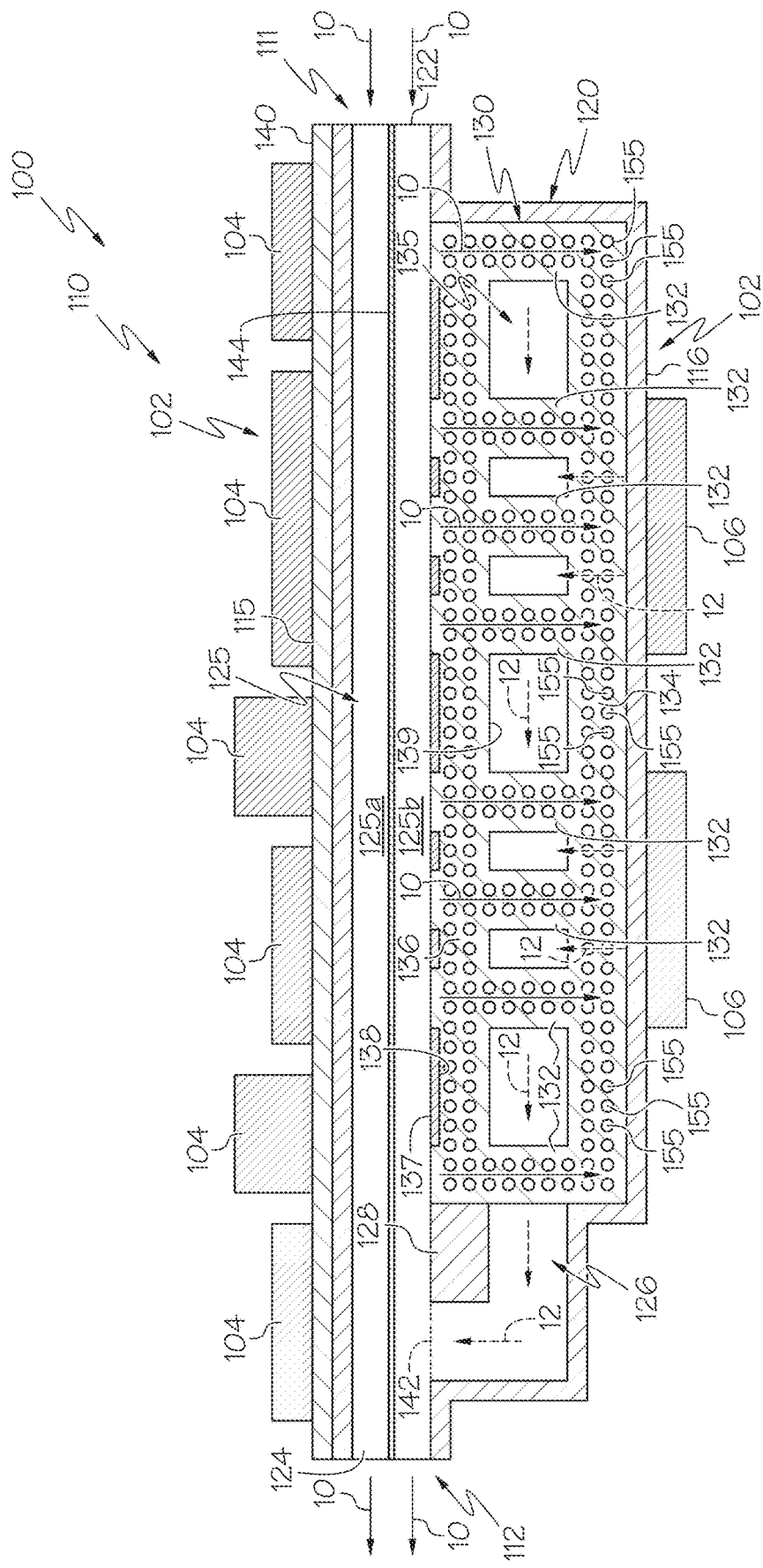
FIG. 3 schematically depicts a cross section of another embodiment of the two-phase cold plate of the power electronics system of FIG. 1 along line A-A, according to one or more embodiments shown and described herein.

Referring now to FIG. 3, another embodiment of the two-phase cold plate 110 is depicted that includes a fluid pathway separator 144 disposed within the fluid pathway 125 to define an upper fluid pathway 125a and a lower fluid pathway 125b. In particular, the fluid pathway separator 144 is disposed between the top surface 115 of the two-phase cold plate 110 and the vaporization structure 130. The fluid pathway separator 144 comprises a non-permeable material, such as a polymer or a metal. The upper fluid pathway 125a is separated from the vaporization structure 130 such that liquid cooling fluid flowing in the upper fluid pathway 125a does not enter the vaporization structure 130. The lower fluid pathway 125b flows over the vaporization structure 130 and is fluidly coupled to the vaporization structure 130 such that at least some of the liquid cooling fluid flowing in the lower fluid pathway 125b enters the vaporization structure 130, for example, the one or more porous feeding posts 132 of the vaporization structure 130, by capillary force.

Referring now to FIGS. 1-3, in operation, cooling fluid flows through the fluid pathway 125, as shown by solid arrow 10, and removes heat from the one or more heat generating devices 102 thermally coupled to the two-phase cold plate 110 by single phase cooling. In some embodiments, the cooling fluid comprises water, such as deionized water, and in other embodiments, the cooling fluid comprises a dielectric fluid such as R-245fa and HFE-7100. When flowing along the fluid pathway 125, at least a portion of the cooling fluid enters the vaporization structure 130, via the one or more porous feeding posts 132 by a capillary force, reaches the porous surface 134, and vaporizes at the plurality of nucleation sites 155 of the porous surface 134 such that vapor flows into the vapor cavity 135 of the vaporization structure 130, as shown by dashed arrow 12. This vaporization removes heat by two-phase cooling from one or more heat generating devices 102 thermally coupled to the vapor cavity 135, such as one or more high heat components 106 coupled to the bottom surface 116 of the two-phase cold plate 110. Cooling fluid that does not enter the vaporization structure 130 or is not vaporized in the vaporization structure 130 exits the fluid pathway 125 through the fluid outlet 124. Vaporized cooling fluid rises into the vapor cavity 135 where it collects then exits through the vapor outlet pathway 126 and flows to the vapor opening 129 and re-enters the fluid pathway 125. Once the vaporized cooling fluid re-enters the fluid pathway 125, the vaporized cooling fluid may condensate back to liquid form before exiting through the fluid outlet 124.

In some embodiments, the one or more heat generating devices 102 may comprise one or more low heat components 104 and one or more high heat components 106. Each of the one or more low heat components 104 may be coupled to the top surface 115 of the two-phase cold plate 110 such that the low heat components 104 may be cooled by the relatively lower efficiency cooling (when compared to vaporization) provided by liquid cooling fluid flowing through the fluid pathway 125. Each of the one or more high heat components 106 may be coupled to the bottom surface 116 of the two-phase cold plate 110 such that the high heat components 106 may be cooled by the relatively higher efficiency (when compared to liquid flow) provided by the vaporization of the cooling fluid at the nucleation sites 155 in the vaporization structure 130 (e.g., the nucleation sites 155 in the porous surface 134 of the vaporization structure 130). In some embodiments, the high heat components 106 comprise power electronics devices, such as an insulated gate bipolar transistor (IGBT), a reverse conducting IGBT (RC-IGBT), a metal-oxide-semiconductor field-effect transistor (MOSFET), a power MOSFET, or the like, and the low heat components 104 comprise the passive electronics that control the operation of the power electronics, such as gate drive devices, capacitors, and inductors.

As shown in FIGS. 1, 2A and 3, the two-phase cold plate 110 may further comprise a bonding substrate 140 disposed between the manifold body 120 and at least one of the one or more heat generating devices 102 to couple the at least one heat generating device 102 to the manifold body 120 while allowing thermal transfer between the manifold body 120 and the at least one heat generating device 102. In FIGS. 1, 2A, and 3, the bonding substrate 140 couples the low heat components 104 to the manifold body 120. In particular, the bonding substrate 140 may define the top surface 115 of the two-phase cold plate 110 and thus couples the top surface 115 of the two-phase cold plate 110 to the one or more low heat components 104. Moreover, embodiments are contemplated with an additional bonding substrate 140 that couples the high heat components 106 to the manifold body 120. In these embodiments, the additional bonding substrate 140 defines the bottom surface 116 of the two-phase cold plate 110 and thus couples the bottom surface 116 of the two-phase cold plate 110 to the one or more high heat components 106.

Figure 4A:
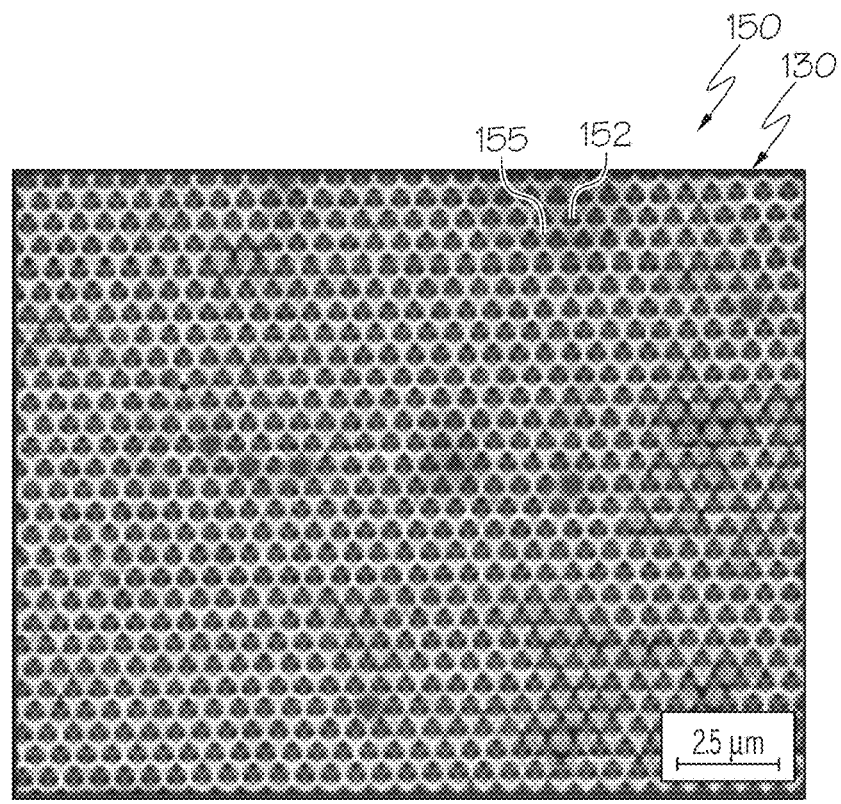
FIG. 4A schematically depicts an example vaporization structure of a two-phase cooling plate comprising a metal inverse opal structure formed by vertical deposition, according to one or more embodiments shown and described herein.
Figure 4B:
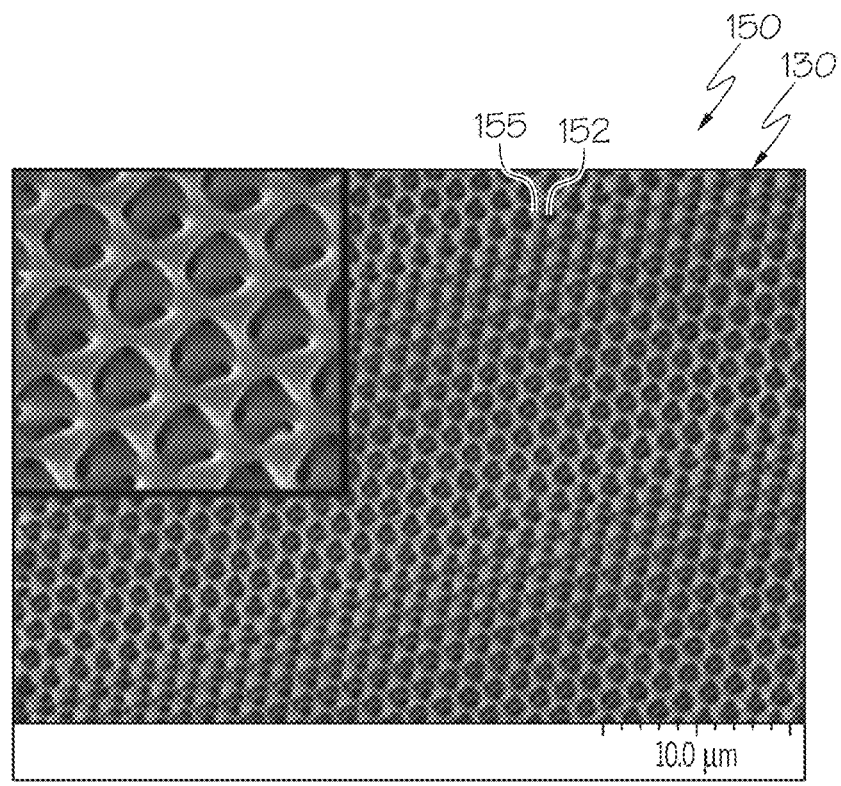
FIG. 4B schematically depicts an example vaporization structure of a two-phase cooling plate comprising a metal inverse opal structure formed by holography, according to one or more embodiments shown and described herein.

Referring now to FIGS. 4A and 4B, portions of an example vaporization structure 130 comprising a MIO structure 150 are schematically depicted. In particular, FIG. 4A schematically depicts an MIO structure 150 formed by vertical deposition and FIG. 4B schematically depicts an MIO structure 150 formed by holography. The MIO structure 150 is porous and provides high capillary pressure for efficient cooling. The MIO structure 150 may provide increased surface area to engage with a cooling fluid to facilitate heat transfer from one or more heat generating devices 102 to the cooling fluid to cool the one or more heat generating devices 102. For example, the MIO structure 150 includes a plurality of networked pores 152 and/or cavities, which operate as nucleation sites 155. The networked pores 152 may extend throughout the MIO structure 150 such that cooling fluid can flow through the networked pores 152 and allow heat to be exchanged between the MIO structure 150 and the cooling fluid. Without intending to be limited by theory, the geometry of the plurality of networked pores 152 may assist in nucleation of the cooling fluid, further assisting in transferring thermal energy from the MIO structure 150 and removing heat from the one or more heat generating devices 102.

For example and without being bound by theory, thermal energy is required for the cooling fluid to change phase (e.g., from a liquid phase to a gaseous phase, or from a liquid phase or a gaseous phase to a supercritical phase), and accordingly, the cooling fluid may absorb significant amounts of thermal energy when changing phase from liquid to vapor. That is, the MIO structure 150 may provide nucleation sites 155 in the networked pores 152 to allow liquid cooling fluid to boil and change phase from single phase liquid to vapor. By encouraging nucleation of the cooling fluid, the geometry of the plurality of networked pores 152 may assist in transferring thermal energy from the MIO structure 150 to the cooling fluid being passed through the MIO structure 150. As the MIO structure 150 is thermally coupled to one or more heat generating devices 102 (specifically, one or more high heat components 106 such as power electronics devices), by transferring thermal energy from the MIO structure 150 to the cooling fluid, thermal energy from the one or more heat generating devices 102 may be dissipated by way of the MIO structure 150 through capillary movement of the cooling fluid.

While in the embodiment depicted in FIGS. 4A and 4B, the MIO structure 150 defines networked pores 152 that are regularly spaced from one another it should be understood that this is merely an example and the networked pores 152 may be positioned at irregular intervals from one another. For example, the spacing and size of the networked pores 152 may be non-uniform to facilitate a non-uniform porosity in the MIO structure 150, such as a graded porosity as described above. An MIO structure 150 may be formed in a variety of ways. For example, the MIO structure 150 may be formed by depositing metal within a sacrificial template. The sacrificial template may include, for example and not as a limitation, microspheres that are dissolved after metal deposition to leave a skeletal network of metal with a periodic arrangement of networked pores 152, which may or may not be etched to increase porosity and interconnection of the hollow spheres. In some embodiments, the sacrificial template may include a photoresist layer that is partially ablated with one or more lasers (e.g., holographic lithography using two or more intersecting lasers, three or more intersecting lasers, four or more intersecting lasers) to create a pattern of networked pores 152, which may then be electroplated. The photoresist layer may thereafter be dissolved or burned off through application of heat, leaving the skeletal network. The MIO structure 150 may be formed of any suitable metal or metal alloy, polymer, semiconductor, and may be for example, a copper inverse opal (CIO) structure, a nickel inverse opal (NIO) structure, and/or the like.

Referring again to FIG. 1, the power electronics system 100 may further comprise a cooling fluid reservoir 180, a fluid pump 182, and a secondary heat exchanger 186, each fluidly coupled to the fluid inlet 122 and the fluid outlet 124 of the manifold body 120. For example, a coolant pipe system 184 may extend between and fluidly couple the fluid inlet 122 and the fluid outlet 124 with each of the cooling fluid reservoir 180, the fluid pump 182, and the secondary heat exchanger 186, and also fluidly couple the cooling fluid reservoir 180 with both the fluid pump 182 and the secondary heat exchanger 186. Moreover, in embodiments where the vapor opening 129 is at an outer surface of the two-phase cold plate 110, the coolant pipe system 184 may also fluidly coupled the vapor opening 129 with each of the cooling fluid reservoir 180, the fluid pump 182, and the secondary heat exchanger 186. The cooling fluid reservoir 180 may house cooling fluid, and the fluid pump 182 may pump the coolant fluid through the two-phase cold plate 110, for example, pump the coolant fluid from the cooling fluid reservoir 180 through the fluid inlet 122 and into the fluid pathway 125 and from the fluid outlet 124 to the secondary heat exchanger 186 and the cooling fluid reservoir 180. Further, the secondary heat exchanger 186 may remove heat collected by the cooling fluid before the cooling fluid enters the cooling fluid reservoir 180.

In operation, cooling fluid may be directed into the fluid inlet 122, for example, cooling fluid may be pumped from the cooling fluid reservoir 180 into the fluid inlet 122 using the fluid pump 182. The cooling fluid may flow from the fluid inlet 122 into the fluid pathway 125. The cooling fluid flows along the fluid pathway 125, as shown by solid arrows 10, thereby removing heat by single phase cooling from one or more heat generating devices 102 thermally coupled to the fluid pathway 125, such as one or more low heat components 104 coupled to the top surface 115 of the two-phase cold plate 110. At least a portion of the cooling fluid enters the vaporization structure 130 via the one or more porous feeding posts 132 by a capillary force, reaches the porous surface 134, and vaporizes at the plurality of nucleation sites 155 of the porous surface 134. Once vaporized, vapor flows into the vapor cavity 135 of the vaporization structure 130, as shown by dashed arrow 12, thereby removing heat by two-phase cooling from one or more heat generating devices 102 thermally coupled to the vapor cavity 135, such as one or more high heat components 106 coupled to the bottom surface 116 of the two-phase cold plate 110. Next, heated liquid cooling fluid may be removed from the fluid pathway 125 via the fluid outlet 124 and heated vapor cooling fluid may be removed from the vapor cavity 135 and directed by into the fluid pathway 125 through the vapor outlet pathway 126 or through the cavity cover 136. Once in the fluid pathway 125, the vaporized cooling fluid condensates back to a liquid and exits the two-phase cold plate 110 through the fluid outlet 124. Directing the vaporized cooling fluid back into the fluid pathway 125 to induce condensation of the vaporized cooling fluid mitigates vapor accumulation within the two-phase cold plate 110, which would increase the pressure in the two-phase cold plate 110, thereby increasing the boiling point of the liquid cooling fluid and reducing the cooling performance of the two-phase cold plate 110.

It should now be understood that the embodiments described herein may be directed to a power electronics system that includes a two-phase cold plate for cooling the one or more heat generating devices, such as power electronic components and passive electronic components, which operate at different heat loads. In particular, the two-phase cold plate includes a manifold body with a fluid pathway for providing single phase cooling and a vaporization structure housed within the manifold body such that the fluid pathway is disposed over the vaporization structure. The vaporization structure includes a cavity cover, a porous surface, a vapor cavity disposed between the cavity cover and the porous surface, and one or more porous feeding posts that fluidly couple the fluid pathway with the porous surface, which includes a plurality of nucleation sites configured to induce vaporization of a cooling fluid and facilitate vapor flow into the vapor cavity to provide two-phase cooling. The two-phase cold plate facilitates a hybrid cooling approach where the low heat generating devices, such as passive electronic components, may be coupled to a top surface of the two-phase cold plate for single phase cooling by liquid cooling fluid flowing in the fluid pathway, and the high heat generating devices, such as power electronics devices, may be coupled to the bottom surface of the two-phase cold plate for two phase cooling by vaporization in the vaporization structure. This hybrid cooling approach provides targeted, efficient cooling in a small form factor package.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A two-phase cold plate comprising:
    a manifold body comprising a fluid inlet and a fluid outlet each fluidly coupled to a fluid pathway housed within the manifold body;
    a vaporization structure housed within the manifold body such that the fluid pathway is disposed over the vaporization structure, the vaporization structure comprising a cavity cover, a porous surface, a vapor cavity disposed between the cavity cover and the porous surface, and one or more porous feeding posts extending between the cavity cover and the porous surface, wherein:
        the one or more porous feeding posts fluidly coupled to the fluid pathway with the porous surface of the vaporization structure; and
        the porous surface comprises a plurality of nucleation sites configured to induce vaporization of a cooling fluid and facilitate vapor flow into the vapor cavity of the vaporization structure.

2. The two-phase cold plate of claim 1, wherein the one or more porous feeding posts exhibit a graded porosity such that a porosity at an interface between the one or more porous feeding posts and the fluid pathway is greater than a porosity of the one or more porous feeding posts at the porous surface.

3. The two-phase cold plate of claim 2, wherein the graded porosity of the one or more porous feeding posts is a continuous graded porosity or a stepwise graded porosity.

4. The two-phase cold plate of claim 1, wherein the cavity cover of the vaporization structure comprises a porous media.

5. The two-phase cold plate of claim 1, wherein:
    the cavity cover comprises a pathway facing surface opposite a cavity facing surface;
    the pathway facing surface faces the fluid pathway and the cavity facing surface faces the vapor cavity; and
    a hydrophilic layer is intermittently disposed on the pathway facing surface of the cavity cover such that surface regions aligned with the one or more porous feeding posts are free of the hydrophilic layer.

6. The two-phase cold plate of claim 1, wherein at least a portion of the vaporization structure comprises sintered metal particles, a metal inverse opal (MIO) structure, or a combination thereof.

7. The two-phase cold plate of claim 1, further comprising a vapor outlet pathway fluidly coupling the vapor cavity of the vaporization structure with the fluid pathway.

8. The two-phase cold plate of claim 7, wherein the vapor outlet pathway and the fluid pathway form an interface at a vapor opening and a selective membrane is disposed at the vapor opening.

9. The two-phase cold plate of claim 1, further comprising a fluid pathway separator disposed within the fluid pathway between a top surface of the two-phase cold plate and the vaporization structure thereby defining an upper fluid pathway and a lower fluid pathway, wherein the lower fluid pathway is fluidly coupled to the vaporization structure.

10. The two-phase cold plate of claim 1, wherein the one or more porous feeding posts extend through the vapor cavity between the cavity cover and the porous surface.

11. A power electronics system comprising:
a two-phase cold plate and one or more heat generating devices thermally coupled to the two-phase cold plate, wherein:
the two-phase cold plate comprises a manifold body having a fluid inlet and a fluid outlet each fluidly coupled to a fluid pathway housed within the manifold body;
a vaporization structure is housed within the manifold body such that the fluid pathway is disposed over the vaporization structure, the vaporization structure comprising a cavity cover, a porous surface, a vapor cavity disposed between the cavity cover and the porous surface, and one or more porous feeding posts extending between the cavity cover and the porous surface, wherein:
the one or more porous feeding posts fluidly coupled to the fluid pathway with the porous surface of the vaporization structure; and
the porous surface comprises a plurality of nucleation sites configured to induce vaporization of a cooling fluid and facilitate vapor flow into the vapor cavity of the vaporization structure.

12. The power electronics system of claim 11, wherein:
the two-phase cold plate comprises a top surface opposite a bottom surface, the fluid pathway is disposed between the vaporization structure and the top surface, the vaporization structure is disposed between the fluid pathway and the bottom surface; and
the one or more heat generating devices comprise one or more low heat components coupled to the top surface of the two-phase cold plate and one or more high heat components coupled to the bottom surface of the two-phase cold plate.

13. The power electronics system of claim 12, wherein the one or more low heat components comprise a gate drive device, a capacitor, an inductor, or a combination thereof and the one or more high heat components comprise a power MOSFET, a transistor MOSFET, an IGBT, an RC-IGBT, or a combination thereof.

14. The power electronics system of claim 11, further comprising a vapor outlet pathway fluidly coupling the vapor cavity of the vaporization structure with the fluid pathway, wherein the vapor outlet pathway and the fluid pathway form an interface at a vapor opening and a selective membrane is disposed at the vapor opening.

15. The power electronics system of claim 11, wherein the one or more porous feeding posts exhibit a graded porosity such that a porosity at an interface between the one or more porous feeding posts and the fluid pathway is greater than a porosity of the one or more porous feeding posts at the porous surface.

16. A method of removing heat from one or more heat generating devices, the method comprising:
directing a cooling fluid through a fluid inlet of a manifold body of a two-phase cold plate and into a fluid pathway disposed in the manifold body, the two-phase cold plate further comprising a vaporization structure fluidly coupled to the fluid pathway, wherein
the cooling fluid flows along the fluid pathway thereby removing heat from the one or more heat generating devices thermally coupled to the two-phase cold plate; and
at least a portion of the cooling fluid enters one or more porous feeding posts of the vaporization structure that fluidly couple the fluid pathway of with a vapor cavity of the vaporization structure thereby vaporizing at least a portion of the cooling fluid at a plurality of nucleation sites within the vaporization structure such that vapor flows into the vapor cavity and removes heat from the one or more heat generating devices thermally coupled to the two-phase cold plate; and
removing heated cooling fluid from a fluid outlet of the manifold body.

17. The method of claim 16, wherein:
the two-phase cold plate comprises an top surface opposite a bottom surface, the fluid pathway is disposed between the vaporization structure and the top surface, the vaporization structure is disposed between the fluid pathway and the bottom surface; and
the one or more heat generating devices comprise one or more low heat components coupled to the top surface of the two-phase cold plate and one or more high heat components coupled to the bottom surface of the two-phase cold plate.

18. The method of claim 17, wherein:
the one or more porous feeding posts fluidly couple the fluid pathway with a porous surface of the vaporization structure; and
at least some of the plurality of nucleation sites are disposed in the porous surface below the vapor cavity such that vaporization of the cooling fluid occurs in the porous surface, facilitating vapor flow into the vapor cavity of the vaporization structure.

19. The method of claim 16, wherein a vapor outlet pathway fluidly couples the vapor cavity of the vaporization structure with the fluid pathway and the method further comprises removing vaporized cooling fluid from the vapor cavity via the vapor outlet pathway such that vaporized cooling fluid enters the fluid pathway and exits the fluid outlet of the manifold body.

* * * * *